(12) United States Patent
Morgan (10) Patent No.: US 9,116,186 B2
(45) Date of Patent: Aug. 25, 2015

(54) DETECTION OF SIGNALS (75) Inventor: David Morgan, Bristol (GB)

(73) Assignee: MBDA UK Limited, Stevenage, Hertfordshire (GB)

( * ) Notice: Subject to any disclaimer, the term of this patent is extended or adjusted under 35 U.S.C. 154(b) by 462 days.

(21) Appl. No.: 13/578,484

(22) PCT Filed: Feb. 10, 2011

(86) PCT No.: PCT/GB2011/050237
§ 371 (c)(1),
(2), (4) Date: Oct. 23, 2012

(87) PCT Pub. No.: WO2011/098810
PCT Pub. Date: Aug. 18, 2011

(65) Prior Publication Data
US 2013/0113659 A1 May 9, 2013

(30) Foreign Application Priority Data
Feb. 10, 2010 (GB) .................................. 1002261.4

(51) Int. Cl.
*G01R 23/16* (2006.01)
*G01R 29/08* (2006.01)
(Continued)

(52) U.S. Cl.
CPC ............ *G01R 23/16* (2013.01); *G01R 29/0871* (2013.01); *G01S 3/046* (2013.01); *G06F 15/00* (2013.01)

(58) Field of Classification Search
CPC ..................................... G01S 3/14; G01S 3/46
USPC ............ 342/442, 443, 444, 463, 465; 702/70, 702/72
See application file for complete search history.

(56) References Cited

U.S. PATENT DOCUMENTS 4,597,107 A 6/1986 Ready et al.
5,271,036 A 12/1993 Lobert et al.
(Continued)

FOREIGN PATENT DOCUMENTS

DE 34 14 929 A1 11/1984
EP 1 253 429 A2 10/2002
(Continued)

OTHER PUBLICATIONS

International Search Report (PCT/ISA/210) issued on May 3, 2011, by the British Patent Office as the International Searching Authority for International Application No. PCT/GB2011/050237.
(Continued)

*Primary Examiner* — Dao Phan
(74) *Attorney, Agent, or Firm* — Scully, Scott, Murphy & Presser, PC (57) ABSTRACT

Described herein is a method and apparatus for the detection of signals in an area of interest. Three sensor channels are provided for sensing radiated emissions in an area of interest, each channel having a sensor and a processor, the three channels sensing radiated emissions in the very low frequency band, the high/very high frequency band, and the ultra high frequency band respectively. The first and third sensor channels provide input signals to the processor in the second sensor channel so that accumulated signal data can be processed to produce an input signal for a comparator. The comparator compares the input signal with data stored in a database to indicate presence of equipment having known modes of operation.

19 Claims, 9 Drawing Sheets

(51) Int. Cl.
*G01S 3/04* (2006.01)
*G06F 15/00* (2006.01)

(56) References Cited

U.S. PATENT DOCUMENTS

| 5,828,334 | A | 10/1998 | Deegan |
| 2003/0167139 | A1 | 9/2003 | Swartz et al. |
| 2006/0082488 | A1 | 4/2006 | Keller, III |
| 2008/0252309 | A1 | 10/2008 | Gross et al. |

FOREIGN PATENT DOCUMENTS

| WO | WO 2006/026139 A1 | 3/2006 |
| WO | WO 2008/023169 A1 | 2/2008 |
| WO | WO 2008/127908 A1 | 10/2008 |

OTHER PUBLICATIONS

International Preliminary Report on Patentability (PCT/IPEA/409) issued on May 10, 2012, by the British Patent Office as the International Searching Authority for International Application No. PCT/GB2011/050237.

Search Report under Section 17(5) dated Mar. 15, 2010.

Zhe, Li, et. al., "EMI-Debugging of Complex Systems Using Different Time, Modulation, STFFT and Frequency Domain Signal Analysis Techniques", Electromagnetic Compatibility Laboratory, Aug. 2005, EMC 2005 International Symposium, p. 607.

Pierson, James et. al., "A New Solution for Signal Intelligence", Summitek Instruments and National Instruments, Mar. 2001, pp. 1-8.

Fig.9. 3 UHF Channels

DETECTION OF SIGNALS

BACKGROUND OF THE INVENTION

The present invention relates to the detection of signals and is more particularly, although not exclusively, concerned with the detection and characterisation of signals relating to the operation of types of equipment using spectral analysis.

In "EMI-Debugging of Complex Systems using different time, modulation, STFFT and Frequency Domain Signal Analysis Techniques" by Zhe Li and David Pommerenke of the Electromagnetic Compatibility Laboratory, Department of Electrical and Computer Engineering, University of Missouri—Rolla, Rolla, MO65409, USA, the application of signal analysis techniques for identifying radiated emission sources is discussed.

In particular, signal analysis techniques that span the time domain via the intermediate modulation and short-term fast Fourier transform (STFFT) domain to the frequency domain are disclosed which provide spectral analysis of equipment of interest, for example, switched power supplies.

In "A New Solution for Signal Intelligence" by James Pierson and Joseph Kovacs of National Instruments, spectrum monitoring and signal intelligence is used to collect and analyse data from communications or other electronic sources to provide data relating to a particular area of interest. Apparatus is disclosed that allows a user to monitor multiple frequency ranges simultaneously by logging data for real-time evaluation and later processing. Processed data can then be compared with stored data to classify the detected signal(s).

In each of the cases discussed above, only spectral analysis of the detected signal(s) is carried out and there is no determination of the modulation on the frequency peaks within the generated spectrum. Information relating to the modulation of the signals at the frequency peaks provides data that is unique to particular modes of operation of types of the equipment being monitored.

SUMMARY OF THE INVENTION

In accordance with one aspect of the present invention, there is provided a method of determining the presence of a radiated emission, the method comprising:—
a) receiving radiated emissions in at least one frequency band;
b) analysing the received emissions to provide a spectral output;
c) processing the spectral output to determine the modulation on the signal in the spectral output;
d) comparing the modulation on the signal with data stored in a database; and
e) determining the nature and presence of the radiated emission from the comparison.

The method of the present invention provides a way of determining whether a particular type of equipment is being used within an area of interest from its radiated emissions. Whilst a single sensor can be used to detect radiated emissions, a more accurate result is obtained when three sensors are utilised, each sensor detecting radiated emissions in a different frequency band. Whilst the frequency bands can overlap, they can also be discrete frequency bands. Signals indicative of sensed radiated emissions are processed to determine the modulation of signal peaks in a spectral analysis to provide an indication of the likelihood of that particular type of equipment is being used.

In accordance with another aspect of the present invention, there is provide apparatus for determining the operation of equipment from its radiated emissions, the apparatus comprising:—
at least one sensor for receiving radiated emissions in at least one frequency band from an area and for generating output signals in accordance with the received radiated emissions;
a processor for receiving and processing the output signals to provide a spectral output signal and for determining the modulation on peaks in the spectral output signal; and
a comparator for comparing the modulation on the peaks with data stored in a database to determine presence of operation of equipment in the area.

In one embodiment of the present invention, three sensors are utilised that operate in different frequency bands, for example, at very low frequencies (VLF) where the radiated emissions are not attenuated by the presence of buildings, at high/very high frequencies (VHF) and at ultra high frequencies (UHF) that enable direction of the source of the radiated emissions to be located.

By utilising VLF having a frequency range of between 10 Hz and 24 or 48 kHz, it is possible to have resolution in the mHz range. For VHF between 100 kHz and 300 MHz and UHF between 30 MHz to 2 GHz, the resolution is 10 Hz.

BRIEF DESCRIPTION OF THE DRAWINGS

For a better understanding of the present invention, reference will now be made, by way of example only, to the accompanying drawings in which:—

DETAILED DESCRIPTION OF THE INVENTION

Figure 1:
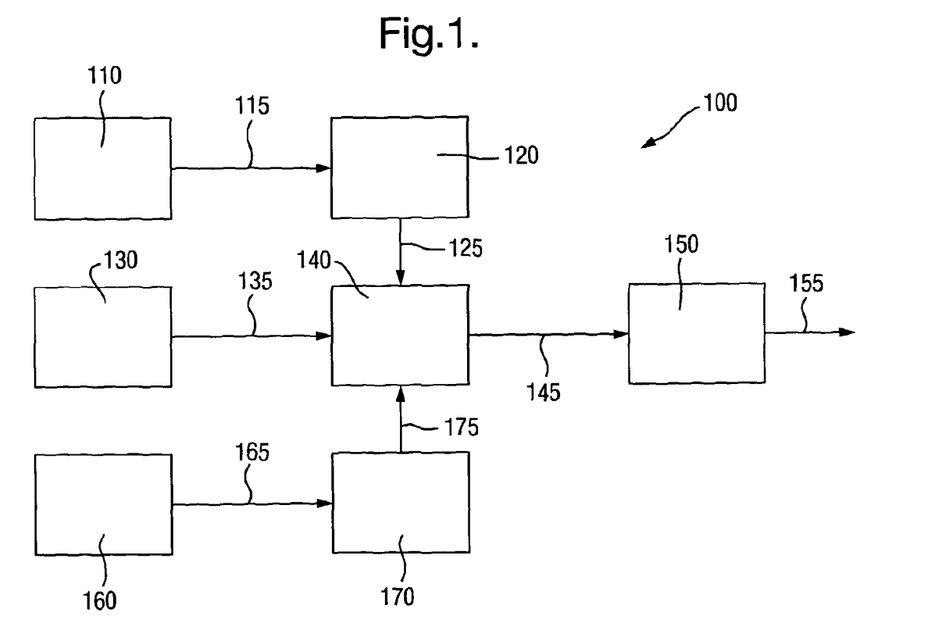
FIG. 1 illustrates a simplified block diagram of a signal detection and analysis system in accordance with the present invention.

FIG. 1 illustrates a block diagram of a signal detection and analysis system 100. The system includes three sensors 110, 130, 160 for detecting radiation from an area. Each sensor 110, 130, 160 provides a respective output signal 115, 135, 165 that is passed to respective ones of processors 120, 140, 170 for processing. Each processor 120, 170 provides a respective output signal 125, 175 which is input into processor 140. Processor 140 provides an output signal 145 to detector 150 that, in turn, provides an output signal 155 that indicates the presence of particular equipment within the area from the detected radiation.

It will be appreciated that processor 140 processes the output signal 135 from processor 130 as well as the processed signals 125 and 175 from processors 120 and 170 respectively.

Sensor 110 and processor 120 together comprise a first sensor channel as will be described in more detail with reference to FIG. 2; sensor 130, processor 140 and detector 150 together comprise a second sensor channel as will be described in more detail with reference to FIG. 3; and sensor 160 and processor 170 together comprise a third sensor channel as will be described in more detail with reference to FIG. 4.

Although only three sensors 110, 130, 160 are shown, it will be appreciated that other numbers of sensors can be utilised according to the desired application. In this case, sensor 110 is used to detect very low frequency (VLF) radiation in the frequency band 10 Hz to 24 kHz, sensor 130 is used to detect high frequency (HF) and/or very high frequency (VHF) radiation in the 30 MHz to 200 MHz frequency band and sensor 160 is used to detect ultra high frequency (UHF) radiation in the 500 MHz to 800 MHz frequency band.

Three discrete frequency bands are described but it will be appreciated that overlapping frequency bands may be utilised if the application requires.

It will be appreciated that FIG. 1 is a simplified diagram of the system according to the present invention and each sensor channel will be described in more detail below.

Figure 2:
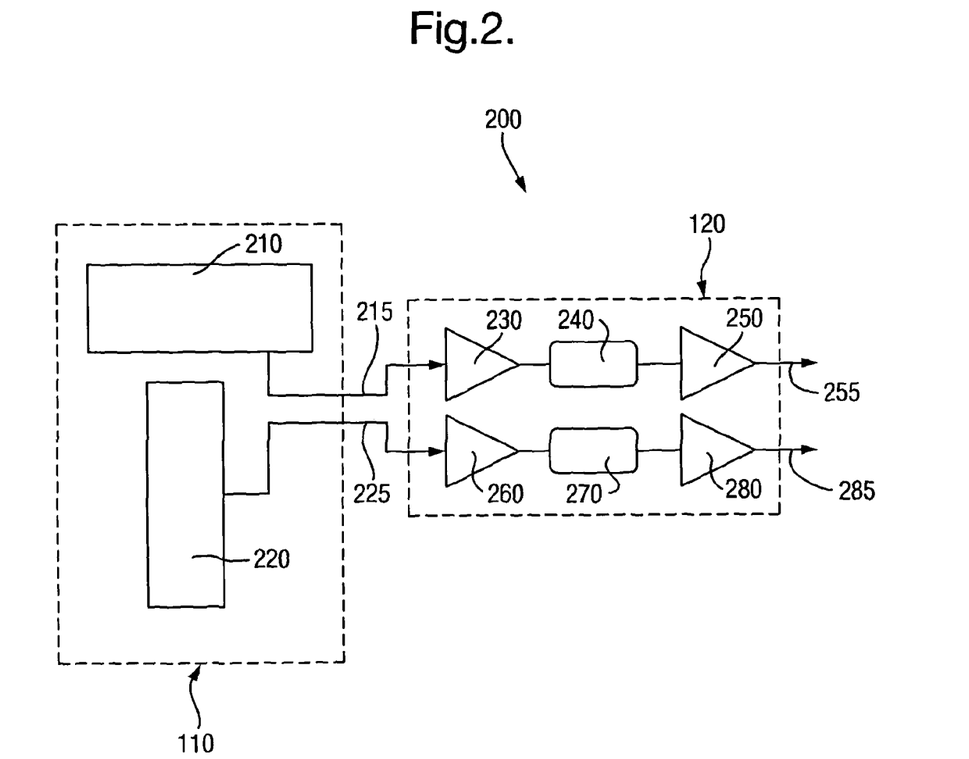
FIG. 2 illustrates a block diagram illustrating a first sensor channel of FIG. 1 that utilises magnetic field sensors.

Referring now to FIG. 2, a first sensor channel 200 is shown. Channel 200 effectively comprises sensor 110 and processor 120 of FIG. 1. Sensor 110 comprises two detector elements 210, 220 in the form of magnetic field sensors. Detector elements 210, 220 detect radiation in the 10 Hz to 24 kHz frequency band. Element 210 comprises a horizontal detector and element 220 comprises a vertical detector, each element 210, 220 being cross-polarised with respect to the other.

Element 210 produces an output signal 215 indicative of the horizontally polarised magnetic field sensed thereat that forms a first input to processor 120. Element 220 produces an output signal 225 indicative of the vertically polarised magnetic field sensed thereat that forms a second input to processor 120.

In processor 120, signal 215 is processed by pre-amplifier 230, a filter 240 and an amplifier 250 to provide output signal 255. Similarly, signal 255 is processed by a pre-amplifier 260, a filter 270 and an amplifier 280 to provide output signal 285.

Output signals 255 and 285 together form the signal 125 that is input to processor 140 in FIG. 1. It will readily be appreciated that signal 125 is shown in FIG. 1 as a single signal for clarity.

The first sensor channel 200, due to its operational frequency band, is not attenuated by the presence of buildings in an area being monitored.

Figure 3:
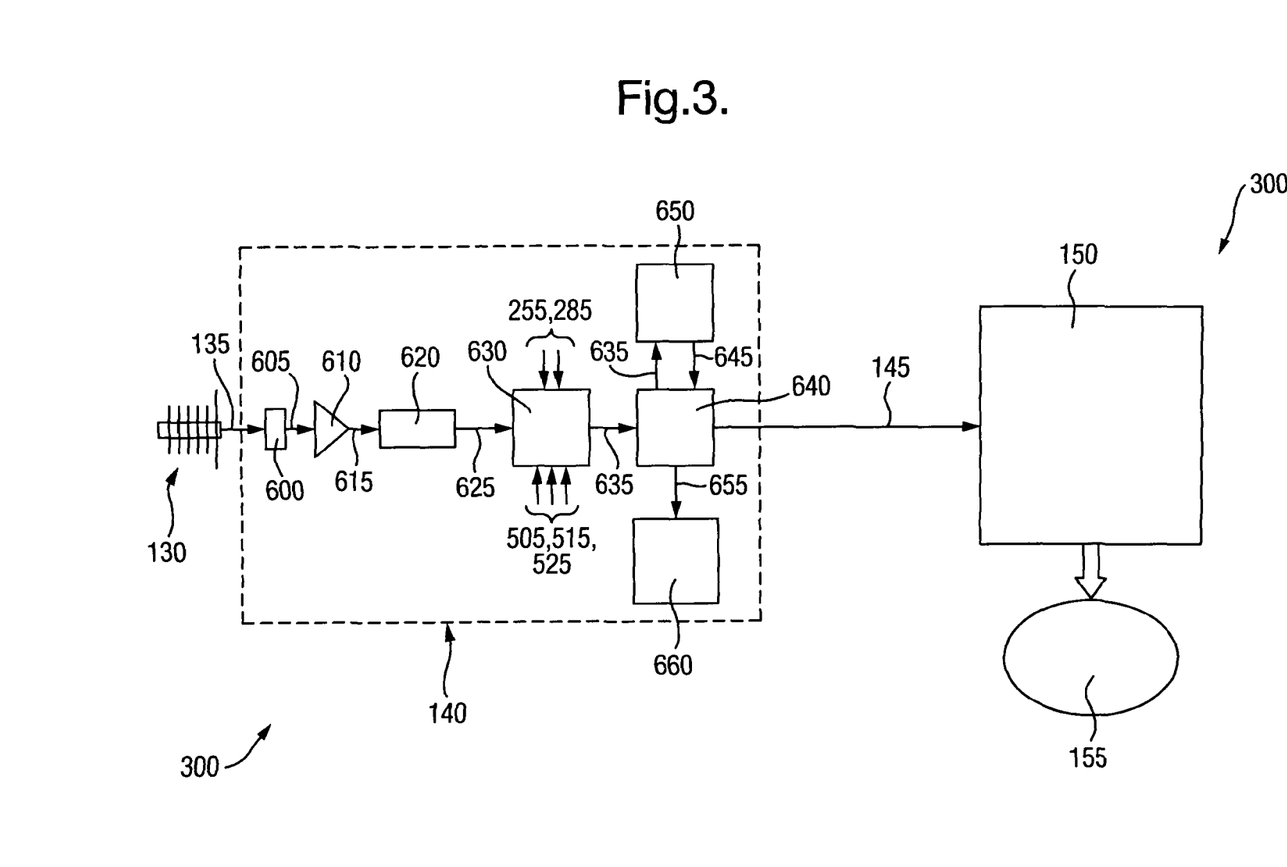
FIG. 3 illustrates a block diagram illustrating a second sensor channel of FIG. 1 that utilises HF and/or VHF receivers.

FIG. 3 shows a second sensor channel 300 that effectively comprises sensor 130, processor 140 and detector 150 as shown in FIG. 1. Sensor 130 comprises a VHF antenna for detecting radiation in the 30 MHz to 200 MHz frequency band. Output signal 135 is passed to processor 140 for processing. The operation and functionality of processor 140 will be described in more detail below. Processor 140 provides output signal 145 for detector 150.

Detector 150 comprises a data fusion and detection statistics module that processes signal 145 to identify the presence of equipment within the area of interest and to provide output 155 indicative of that presence.

Figure 4:
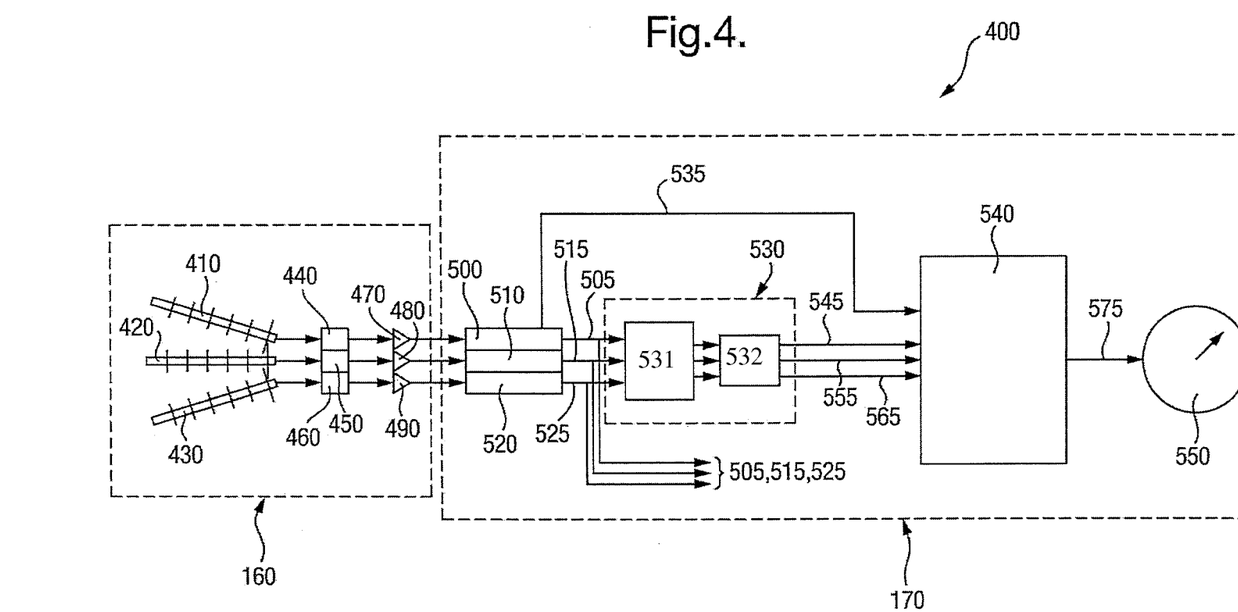
FIG. 4 illustrates a block diagram illustrating a third sensor channel of FIG. 1 that utilises UHF receivers.

Referring now to FIG. 4, a third sensor channel 400 is shown that effectively comprises sensor 160 and processor 170 of FIG. 1. Sensor 160 comprises three UHF antennas 410, 420, 430 that are spaced at 30° apart which together give 70° of reception. This provides the ability to provide directionality of the radiation being detected from the area of interest. Each antenna 410, 420, 430 within sensor 160 is connected to a respective one of UHF narrowband filters 440, 450, 460 and a respective one of UHF pre-amplifiers 470, 480, 490. The output from each pre-amplifier 470, 480, 490 together forms output signal 165 in FIG. 1 (not referenced in FIG. 4).

Processor 170 comprises three UHF receiver modules 500, 510, 520, one for each antenna 410, 420, 430; an estimator unit 530 including a signal conditioner 531 and amplitude estimator 532, a comparator 540 and a direction display 550.

Output signal 165 from sensor 160 is input to the UHF receiver modules 500, 510, 520 and each module 500, 510, 520 provides a demodulated UHF output signal 505, 515, 525 that is input into the estimator unit 530.

Signals 505, 515, 525 are also input into processor 140 of FIGS. 1 and 2, the operation of processor 140 being described in more detail below.

Gain control signals 535 from the receiver modules 500, 510, 520 are fed into the comparator 540. Comparator 540 compares the signals 535 and output signals 545, 555, 565 from the estimator unit 530 to provide an output signal 575 that can be displayed on direction display 550 which indicates the directionality of the signals received by the antennas 410, 420, 430.

Returning now to FIG. 3, the operation of processor 140 will be described in more detail. Processor 140 comprises a VHF filter 600, a VHF pre-amplifier 610, a VHF receiver 620, a multiple analogue-to-digital converter (ADC) 630, a microprocessor 640, a signal store 650 and a spectral analysis unit 660.

Output signal 135 from sensor 130 is input to the VHF filter 600 where it is filtered to provide a filtered signal 605 for the VHF pre-amplifier 610. Pre-amplifier 610 provides an amplified signal 615 for the VHF receiver 620. VHF receiver 620 processes the amplified signal 615 and provides a demodulated VHF output signal 625 to the ADC 630. The ADC 630 also receives output signals 255, 285 from processor 120 in FIGS. 1 and 2 and three demodulated UHF output signals 505, 515, 525 from processor 170 in FIGS. 1 and 4.

The ADC 630 digitises all the signals received and provides an output signal 635 to the microprocessor 640. The microprocessor 640 passes signal 635 to the signal store 650 for storage on line 655 for further processing at a later date if required. Signals are retrieved from the signal store 650 by the microprocessor 640 on line 645.

Figure 5:
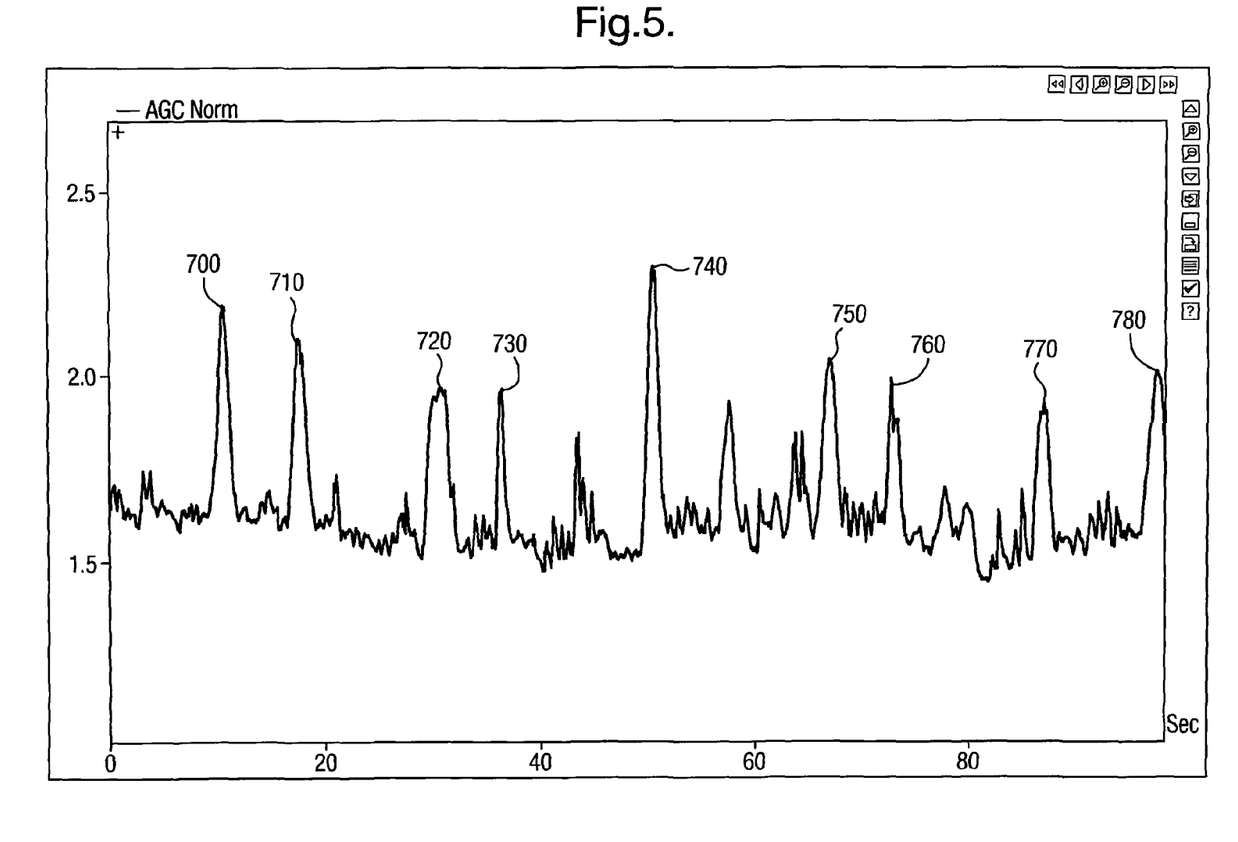
FIG. 5 illustrates an example of a spectral analysis signal that can be obtained from the sensor channels shown in FIGS. 2 to 4.

The microprocessor 640 processes signal 635 to generate a spectral analysis signal 655, as shown in FIG. 5, that corresponds to the combination of all three frequency bands from all three sensors 110, 130, 160.

Figure 6:
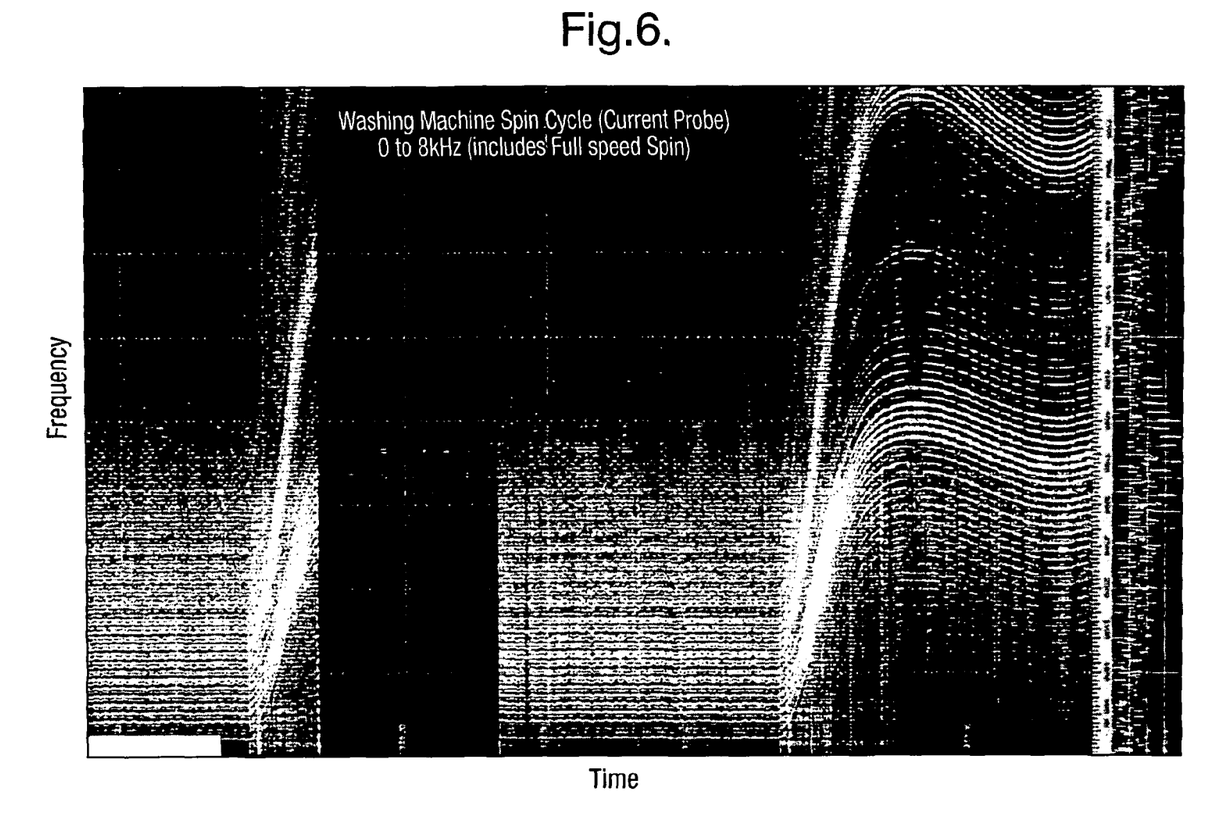
FIG. 6 illustrates an example of a waterfall analysis plot that can be obtained from the sensor channels shown in FIGS. 3 and 4.

Spectral analysis signal 655 is output to the spectral analysis unit 660 for further processing. In the spectral analysis unit 660, a waterfall spectral analysis is carried out to provide a waterfall output of frequency over time as shown in FIG. 6. The waterfall output is intended to be viewed by an operator of the system.

Microprocessor 640 also generates output signal 145 that is input into the data fusion and detection statistics module 150 where it is evaluated to give an indication of a particular type of equipment is being used. The indication is given at output 155.

Data fusion and detection statistics module 150 includes a database that contains information relating to known signal characteristics of types of equipment in operation. This module compares signal 145 with the information stored in the database and generates a probability that a particular type of equipment is being operated in the area being monitored by the system in accordance with the present invention.

FIG. 5 illustrates an example of a spectral analysis signal 655 that is obtained from the system, that is, it is a combination of the output signals from all three sensors 110, 130, 160. However, analysing such a signal does not provide sufficient information to make the necessary determination relating to the operation of particular equipment. Further processing of the signal peaks 700, 710, 720, 730, 740, 750, 760, 770, 780 is needed to make such a determination.

This signal can be displayed to enable an operator to understand the occupancy of signals within the spectrum so that a clear space can be selected to enable monitoring of equipment under test (EUT). By measuring both the 'ambient' spectrum and the 'ambient' plus EUT spectrum, it is possible to subtract them to determine the EUT component.

In the microprocessor 640, analysis of the modulation of the signals on the signal peaks 700, 710, 720, 730, 740, 750, 760, 770, 780 is carried out and it is from this modulation that the determination relating to the operation of particular equipment is determined.

FIG. 6 illustrates an example of the output from the spectral analysis unit 660 which is provides information relating to frequency over time. The output is known as a waterfall plot. From this, it is possible to identify particular types of equipment in their operating modes. In FIG. 6, the waterfall plot for a washing machine spin cycle is shown.

Figure 7:
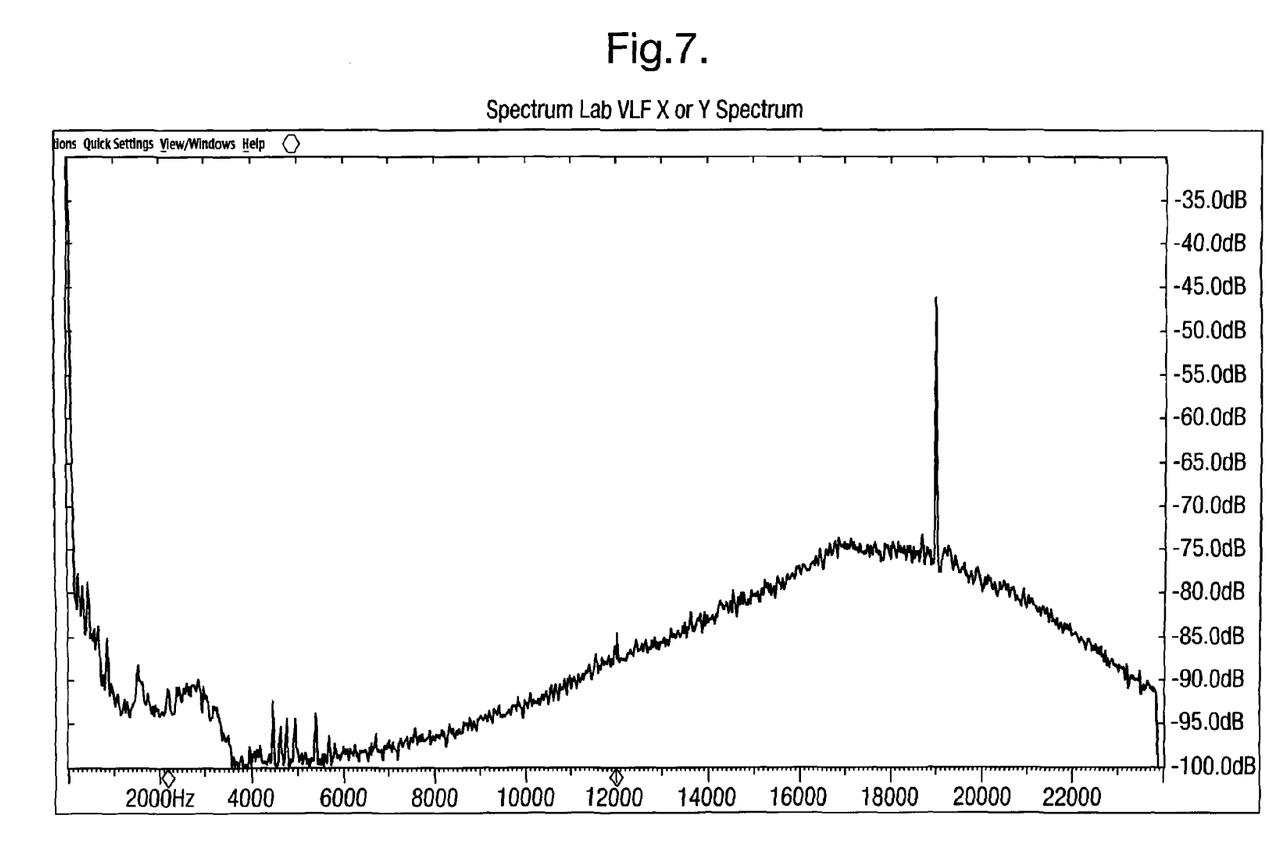
FIG. 7 illustrates an example of a spectral analysis signal that can be obtained from one of the detectors in the sensor channel shown in FIG. 2.

An example of one of the spectral output signals 255 and 285 from the first sensor channel 200 (FIG. 2) is illustrated in FIG. 7. It is to be noted that this is a simple VLF spectrum and Fast Fourier Transform (FFT) can be used for averaging depending on whether the signal is persistent or transient.

The VLF ambient spectrum may be rich in signals, particularly those related to mains frequency and harmonics. An operator of the system needs to be able to determine ambient signals and their associate spectra to enable the EUT signal to be distinguished.

Figure 8:
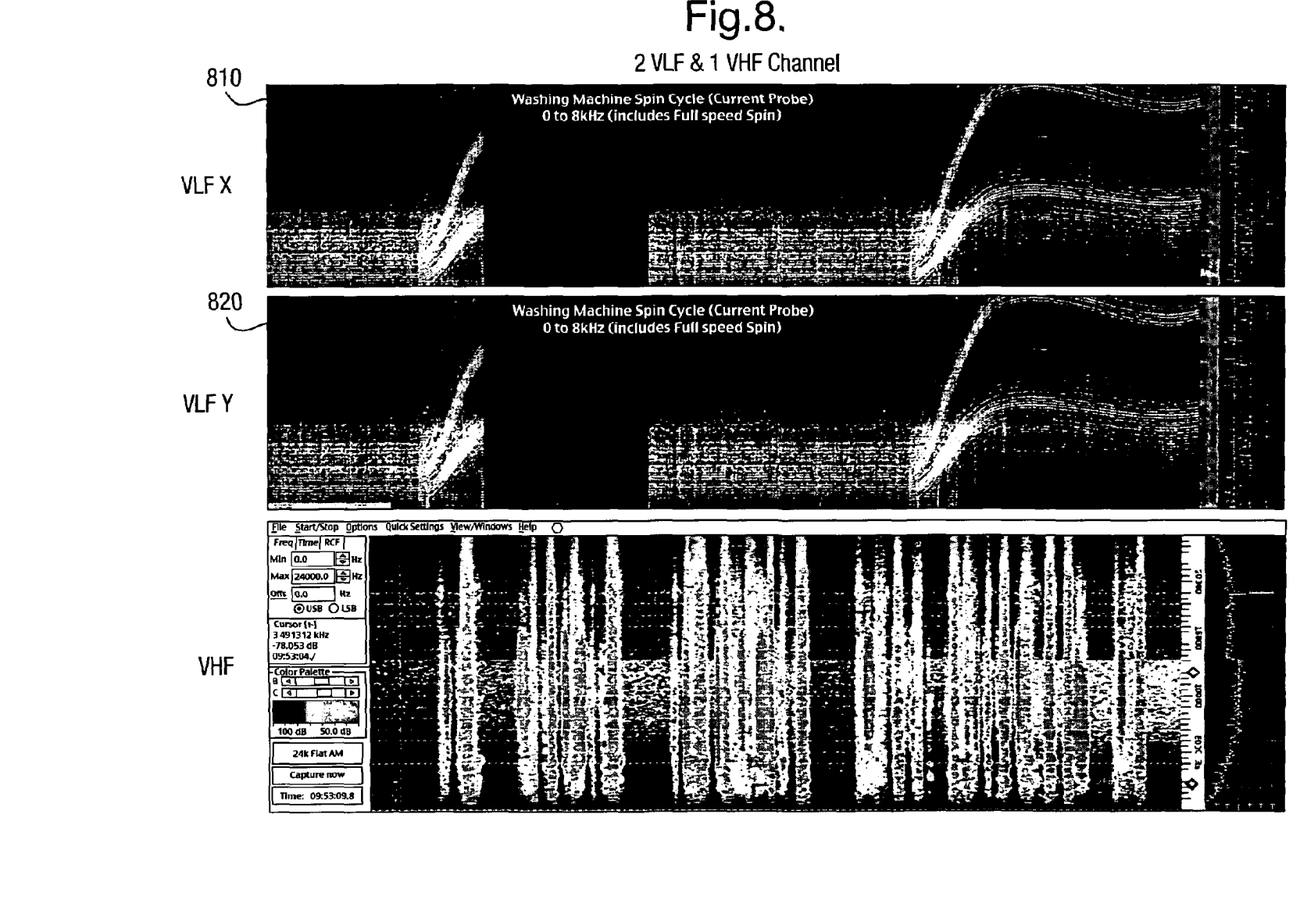
FIG. 8 illustrates an example of a display obtained from the detectors in the sensor channel shown in FIG. 2 and the antenna in the sensor channel shown in FIG. 3.

FIG. 8 illustrates an example of data can be displayed to an operator of the system—waterfall plots 810, 820 for respective ones of detector elements 210 and 220 (FIG. 2), and the modulation of the signal 135 generated by sensor 130 (FIGS. 1 and 3. The waterfall plots are generated by Fourier transforms of sampled incoming signal, converting time domain signals into the displayed frequency domain. The waterfall plots show a number (several thousand) of samples in a graphical format. It shows how the frequency information, or modulation, varies over time.

At any instant a signal is defined by the point in time and the amplitude of the signal. This is what can be measured and the signal is said to be in the time-domain. However, when looked at over time, the signal can be seen to have a peak at a base or carrier frequency with some variation either in amplitude or frequency about this. The variation is called the modulation. By examining how the signal varies over a short period of time, called sampling, and applying a Fourier transform, the modulation of the signal can be examined. As an example, the signal amplitude may be sampled every 1 ms a thousand times, and this information is used to determine the modulation. The modulation information is then said to be in the frequency-domain.

Figure 9:
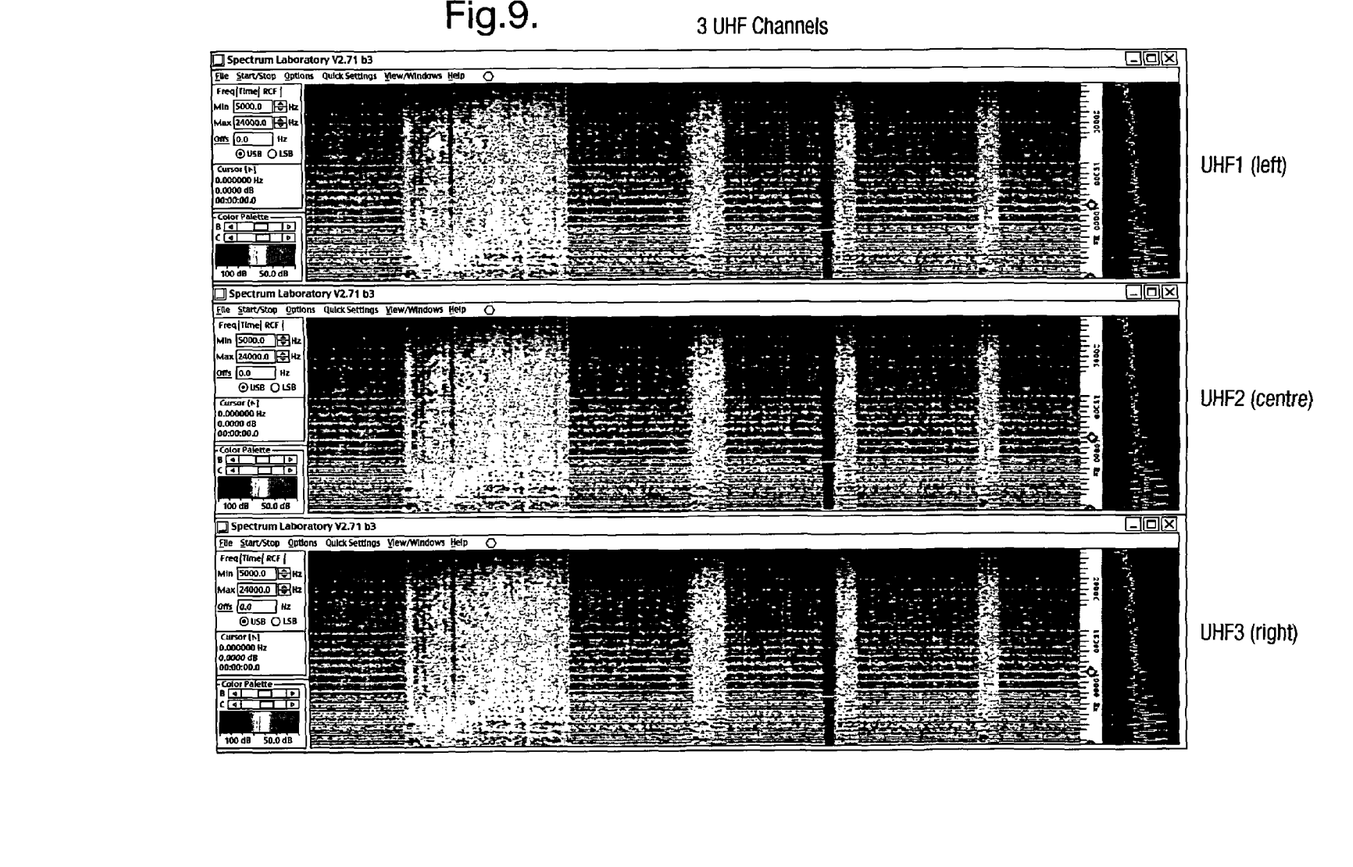
FIG. 9 illustrates an example of a display obtained from the detectors in the sensor channels shown in FIG. 4.

FIG. 9 illustrates an example of data that can be displayed to and operator of the system—the modulation on the three UHF output signals 505, 515, 525 shown in FIG. 4.

Suitable commercially available low cost receivers can be used in the system of the present invention. Such receivers may cover a range of frequencies from, say, 100 kHz to 2 GHz with a 20 kHz wide amplitude modulation, or from 5 kHz to 3.3 GHz with a 20 kHz amplitude modulation.

It is possible to mount the system of the present invention in a rack configuration with either a rack-mounted computer or a tower computer. Each rack in this case will include at least one display for displaying data to an operator of the system.

Various display modes (not illustrated) may be provided. For example, a display may be configured to show data from the UHF channel that includes spectral data, modulation strength at multiple frequency bands, a waterfall plot and a simple spectrum. In another example, the display may be configured to show data from one VLF channel and the VHF channel that includes waterfall plots and associated spectral data. Ideally, the display is set up to confirm that signals are being sensed in each frequency band and to ensure that no signal overloads exist. If the signals are too large and distortion occurs, the spectral data may become unusable. UHF modulation strength provides an indication of the long-term stability of the source but can be substituted for another spectrum if required.

The display shown in each of FIGS. 8 and 9 enables an operator to correlate, by eye, the radiated emissions from all channels. However, it may be necessary to provide data in the form of signals for further processing.

When monitoring the display shown in FIG. 9, an operator is able to see the waterfall plot and spectrum from each of the three UHF antennas and can compare their strengths to indicate a possible direction of arrival of the radiated emissions.

The invention claimed is:

1. A method of determining an operation of equipment in an area based on radiated emissions of the equipment, the method comprising:
   a) receiving radiated emissions in at least one frequency band;
   b) generating at least one spectral output signal indicative of the received radiated emissions, the at least one spectral signal having peaks;
   c) processing each spectral output signal to determine modulation on the peaks over time in the spectral output signal;
   d) comparing the modulation on the peaks with data stored in a database; and
   e) determining a presence of operating equipment in the area from the comparing.

2. A method according to claim 1, wherein step a) comprises:
   receiving radiated emissions in three frequency bands.

3. A method according to claim 2, wherein the frequency bands are discrete.

4. A method according to claim 2, wherein the frequency bands are very low frequency, high frequency/very high frequency and ultra high frequency.

5. Apparatus for determining an operation of equipment from radiated emissions of the equipment, the apparatus comprising:
   at least one sensor for receiving radiated emissions in at least one frequency band from an area and for generating output signals in accordance the received radiated emissions;

a processor for receiving and processing the output signals to provide a spectral output signal having peaks, and for determining modulation on the peaks over time in the spectral output signal; and a comparator for comparing the modulation on the peaks with data stored in a database to determine presence of operating equipment in the area.

6. Apparatus according to claim 5, wherein the at least one sensor comprises:

a pair of magnetic field sensors, one arranged vertically and the other horizontally.

7. Apparatus according to claim 6, wherein the magnetic field sensors operate in very low frequency band relative to other sensors included in the apparatus.

8. Apparatus according to claim 6, comprising:

a first processor for processing first signals received by the magnetic field sensors, and for providing first output signals indicative of the first received signals.

9. Apparatus according to claim 5, wherein the at least one sensor comprises:

an antenna operating in a high/very high frequency band relative to other sensors included in the apparatus.

10. Apparatus according to claim 9, comprising:

a second processor for processing second signals received by the antenna and for providing second output signals indicative of the second received signals.

11. Apparatus according to claim 5, wherein the at least one sensor comprises:

three antennas operating in an ultra high frequency band of 30 MHz or greater.

12. Apparatus according to claim 11, comprising:

a third processor for processing third signals received by the three antennas, and for providing third output signals indicative of the third received signals.

13. Apparatus according to claim 5, wherein the at least one sensor comprises:

a pair of magnetic field sensors operating in a relatively very low frequency band and arranged with one sensor located substantially vertically and the other substantially horizontally;

an antenna operating in a relatively high/very high frequency band; and three antennas operating in a relatively ultra high frequency band.

14. Apparatus according to claim 13, comprising:

a first processor for processing signals received by the magnetic field sensors and providing first output signals indicative of the first received signals;

a second processor for processing second signals received by the antenna and for providing second output signals indicative of the second received signals; and a third processor for processing third signals received by the three antennas and for providing third output signals indicative of the third received signals.

15. Apparatus according to claim 14, wherein the second processor also processes the first output signals from the magnetic field sensors and the third output signals from the three antennas to provide an input signal for the comparator.

16. Apparatus according to claim 5, wherein the comparator comprises:

a data fusion and detection statistics module.

17. Apparatus according to any one of claim 5, comprising:

signal storage within the second processor for storing signals for later processing.

18. Apparatus according to claim 12, comprising:

a direction display; and a comparator for providing an output signal that can be displayed on the direction display to indicate directionality of signals received by the three antennas.

19. Apparatus according to claim 5, comprising:

a spectral analysis unit for providing an output signal having information relating to frequency over time, for said modulation.

\* \* \* \* \*